United States Patent
Kelsey

[11] Patent Number: 5,731,536
[45] Date of Patent: Mar. 24, 1998

[54] AUDIO SIGNAL PROCESSING CIRCUIT FOR ELECTRIC GUITARS FOR SIMULATING THE SOUND PRODUCED BY THE COMBINATION OF AN AMPLIFIER AND MICROPHONE

[75] Inventor: James G. Kelsey, Hilton, N.Y.

[73] Assignee: Whirlwind Music Dist. Inc., Rochester, N.Y.

[21] Appl. No.: 734,396

[22] Filed: Oct. 16, 1996

[51] Int. Cl.⁶ ............................................. G10H 1/12
[52] U.S. Cl. ............................. 84/736; 84/DIG. 9
[58] Field of Search .......................... 84/735, 736, 737, 84/661, 699, DIG. 9

[56] References Cited

U.S. PATENT DOCUMENTS

| | | |
|---|---|---|
| 4,405,832 | 9/1983 | Sondermeyer . |
| 4,937,874 | 6/1990 | Pittman et al. . |
| 4,995,084 | 2/1991 | Pritchard . |
| 5,133,014 | 7/1992 | Pritchard ............... 84/735 X |

Primary Examiner—William M. Shoop, Jr.
Assistant Examiner—Jeffrey W. Donels
Attorney, Agent, or Firm—Shlesinger Fitzsimmons Shlesinger

[57] ABSTRACT

The device is designed to receive at its input the analog AC output signal of an electric guitar either directly from the guitar, its amplifier or a speaker. The incoming signal is fed to three series connected circuits which successively boost the bass and treble frequencies, and then reduce the signal level between the bass and treble peaks before applying the processed signal to an output circuit. A high frequency adder circuit connected in parallel with the three series connected circuits permits frequencies above a certain level (10 KHz) to be added back to the processed signal at the output circuit. One switch is operable in the bass boost circuit to introduce different resistance selectively to raise or lower the frequency center and gain of the circuit, and another switch at the input of the device is operable to add resistance when the input signal is from a speaker.

10 Claims, 2 Drawing Sheets

AUDIO SIGNAL PROCESSING CIRCUIT FOR ELECTRIC GUITARS FOR SIMULATING THE SOUND PRODUCED BY THE COMBINATION OF AN AMPLIFIER AND MICROPHONE

BACKGROUND OF THE INVENTION

This invention relates to electric guitars, and more particularly to apparatus which is designed to be substituted in place of a microphone of the type normally is used to distribute the sound produced by the speaker of an electric guitar amplifier. More specifically this invention relates to an audio signal circuit which is designed to simulate the sound produced by a microphone when used in combination with a common guitar amplifier.

Heretofore it has been commonplace to employ a vacuum tube guitar amplifier the speaker output of which is placed behind, or in combination with a conventional microphone, which then distributes the sound to a number of outlets in a large theater, or the like. The problem is that microphones are not always available, or if available, do not satisfactorily reproduce the sound produced by a guitar's amplifier and speaker.

Furthermore, the use of both a guitar amplifier and its speaker in combination with a microphone adds considerably to the cost and quantity of equipment required to produced the desired sound from an electric guitar. Moreover, when a microphone is employed it picks up undesirable acoustical vibrations and background sounds.

Accordingly, it is an object of this invention to provide an novel audio signal device, which can be used in place of a conventional guitar amplifier and associated microphone, and yet reproduces and enhances the tonal quality of the sound produced by a conventional amplifier and microphone combination.

Still another object of this invention is to provide a novel audio signal device of the type described which eliminates objectionable background noise which might otherwise be introduced through a microphone when the latter is employed in combination with the a conventional guitar amplifier.

Other objects of this invention will be apparent hereinafter from the specification and from the recital of the appended claims, particularly when read in conjunction with the accompanying drawings.

SUMMARY OF THE INVENTION

To produce a novel substitute device for a common vacuum tube guitar amplifier and associated microphone that is normally placed in front of the amplifier speaker, a frequency analyzer was employed to plot the frequency curves produced by such an amplifier/microphone combination. Thereafter the hereinafter described analog audio signal circuit was created to match as closely as possible the frequency curves (graphs) produced by the frequency analyzer. The filters of the resultant audio signal circuit then were designed in such manner that the component values thereof were fine tuned to create the most desired sounds. The result was a device containing an analog filter circuit which creates a tonality of the sound far superior to prior art devices such as the DOD Electronics Model 285, and the Hughes and Getnerd's model MKIII.

Typically the device is employed by plugging the output signal jack of an electric guitar into the input jack of the device, and plugging the output of the device into a microphone input on a conventional mixing board. The sound then heard through the mixing board, for example in a PA system, or if recording the sound recorded on a tape or the like, will be that produced by the filter circuit of the novel audio signal device. The device reproduces the tonality of a vacuum tube guitar amplifier with a microphone placed in front of the amplifier's output speaker, but without the need for employing such an amplifier/microphone combination. As a consequence, since no microphone is employed, the undesirable acoustical vibrations and background noises, which commonly are picked up by a microphone, are eliminated.

THE DRAWINGS

FIG. 1 is a block diagram illustrating schematically a novel audio signal processing device made according to one embodiment of this invention; and FIG. 2 is a wiring diagram illustrating a novel audio signal circuit which forms part of the device shown in FIG. 1.

DETAILED DESCRIPTION OF THE PREFERRED EMBODIMENTS

Figure 1:
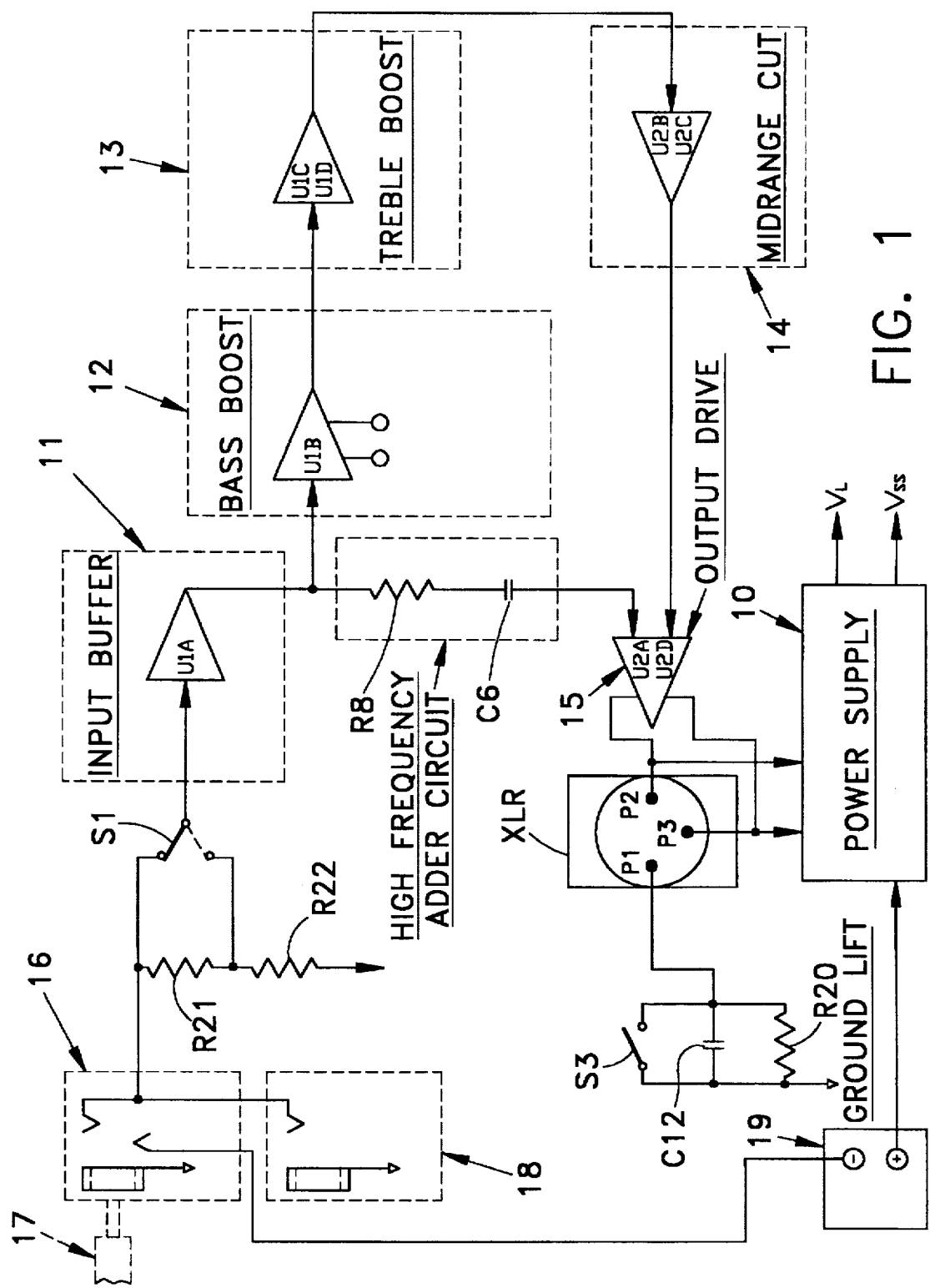

Referring first to the block diagram shown in FIG. 1, the novel device disclosed herein includes five principal parts, including a power supply 10 and four separate filter circuits, which are enclosed by broken lines in FIG. 1, and are denoted generally by the numerals 11, 12, 13 and 14. Circuit 11 constitutes an input buffer circuit which receives an incoming audio signal, as noted hereinafter, and which has its output connected in parallel with the input to circuit 12, and through a resistor R8 and capacitor C6 to an output drive circuit denoted in FIG. 1 by the numeral 15. Circuit 12 functions as a bass boost circuit for the incoming audio signal, and has its output connected in series with the input of circuit 13, which functions as a treble boost for the audio signal. The output of circuit 13 is connected to the input of circuit 14, which constitutes a midrange cut or tuned notch filter, the output of which is connected to the output drive 15. The output of the drive 15 is connected to pins 2 and 3 of an XLR connector, and to the power supply 10. Thus, as shown in FIG. 1, the bass boost circuit 12, the treble boost circuit 13 and the midrange cut circuit 14 are connected in series with each other, and in parallel with resistor R8 and capacitor C6, which function as a high frequency adder circuit that allows previously blocked high frequencies to be added to the audio signal at the output drive circuit.

Each of the circuits 11 through 15 includes one or more low power operational amplifiers in the form of an integrated circuit offered for sale by Texas Instrument under the designation TL064. In the drawings each of these IC circuits is denoted or identified as U1A, U1B, U1C, U1D, U2A, U2B, U2C and U2D. Also as shown in FIG. 1, the audio signal input to the buffer circuit 11 comprises a conventional input receptacle 16 adapted to receive the output jack 17 (shown fragmentarily and in phantom by broken lines in FIG. 1) of either an electric guitar, the guitar's amplifier, or the speaker of the guitar's amplifier. Moreover, the tip and sleeve contacts of the receptacle 16 are connected in parallel with the coresponding tip and sleeve contacts of another receptacle 18, which is mounted adjacent receptacle 16. Receptacle 18 is not connected to the circuits 11–15, but is used only if it is desired to have the audio input to 16 outputed directly to a guitar amplifier without being processed by circuits 11–15.

In any event, the input receptacle 16 is designed in such manner that when the jack 17 is inserted into receptacle 16, the negative terminal of a battery 19, which forms part of the power supply 10, is connected to the ground terminals of the hereinafter described circuits. The incoming signal from jack 17 can be applied directly to the buffer circuit 11 through a switch S1, when the switch is in its full line position as shown in FIG. 1, or can be attenuated through the resistors R21 and R22 when the switch S1 is swung to its broken line position. Also, the power supply 10 comprises a conventional circuit which may be energized either by the nine volt battery 19, or by what is commonly known in the audio industry as a host phantom power provided by a conventional mixing board. Such phantom power, when employed, is supplied from pins P1,P2 and P3 of a conventional XLR connector. In any event the power supply 10 produces a line voltage $V_L$ which powers each of the TL064 IC circuits, and a voltage $V_{ss}$, which is one half the line voltage $V_L$, and which supplies the bias voltage for all of the AC (audio) signals.

Figure 2:
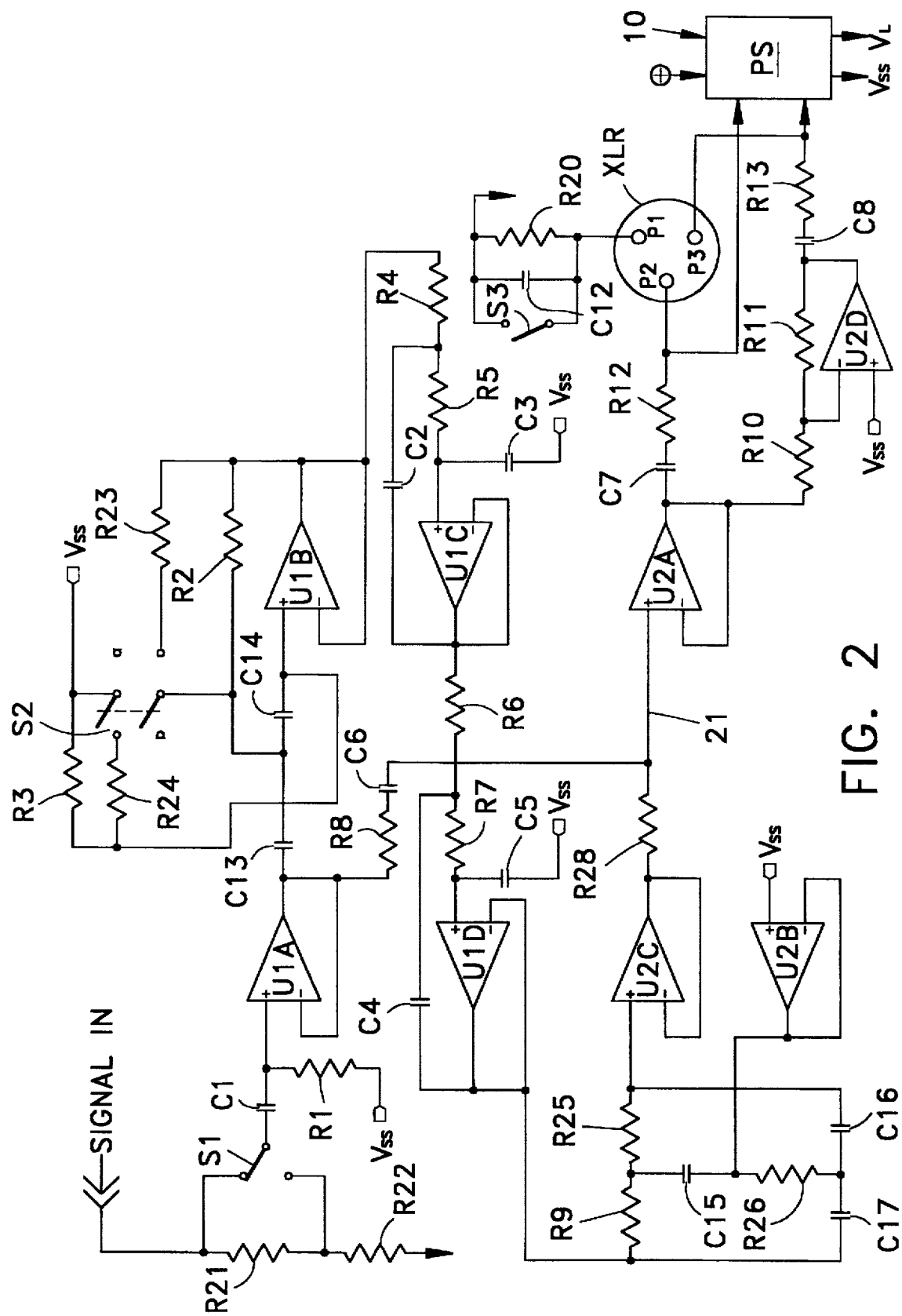

Referring now to FIG. 2, and assuming that switch S1 is in its full line position, and that the incoming AC audio signal is produced by and is being outputted directly from an electric guitar, the incoming signal is coupled with capacitor C1 and then is biased by resistor R1 and the DC voltage supply $V_{ss}$. The signal is then buffered by the U1A circuit which acts as a voltage follower, and has the low impedance output thereof connected in parallel with the adder circuit comprising resistor R8 and capacitor C6, and with the first filter section 12 comprising capacitors C13, C14, switch S2 and resistors R2, R3, R23 and R24. This is the bass boost circuit, which is a voltage controlled voltage source (VCVS) circuit, and the values of the components in this circuit are tuned so that the slopes or sides of this filter are 24 dBm per octave. Switch S2 is a two-position switch, and in one position of which the switch changes the resistance of the circuit by paralleling resistors R23 and R2 constitutes a so-called dark mode of operation. Alternatively, when switch S2 is in its other position its connects resistors R24 and R3 in parallel which constitutes the so-called bright mode of operation. Switch S2 thus, functions selectively to change the bass boost circuit frequency center and gain from 195 Hz and 5.5 dBm gain in the bright position, to 95 Hz and 12.7 dBm of gain in the dark position or mode.

The second filter circuit 13, which is the treble boost filter, employs the IC circuits U1C, U1D, resistors R4, R5, capacitors C3, C2, resistors R6, R7, and capacitors C5 and C4. This is a fourth order voltage controlled voltage source (VCVS) type of filter, the circuit elements having values selected to create 24 dBm per octave slopes with a +8.7 dBm boost at 4.0 KHz.

The third active circuit 14, the tuned notch filter or midrange cut circuit, comprises resistors R9 and R25, capacitor C15, resistor R26, capacitors C16, C17 and the IC circuits U2C and U2B. This circuit is employed to reduce the level in between the bass and treble peaks of the amplified signal at a slope (or curve) of 12 dBm per octave. The frequency center of the tuned notch filter circuit is 1 KHz with a cut of 9.3 dBm.

The fourth circuit, which is in parallel with all three active filter circuits 12, 13 and 14, is the high frequency adder circuit comprising the resistor R8 and the capacitor C6, and which allows frequencies over 10 KHz to be added back at a 20 dBm lower level, the high frequency boost circuit 13 having previously removed frequencies over 10 KHz.

Finally, the output section or output drive 15 receives on line 21 (FIG. 2) the output of the filter section through resistor R28, and creates a balanced (or differential) output for the XLR output connector using components U2A, U2D, capacitor C7, resistors R12, R10, R11, and capacitor C8 and resistor R13. The IC circuit U2A is a unity gain buffer, and outputs audio signals to pin P2 of the XLR connector via capacitor C7 and resistor R12. The output U2A also is applied to the input of U2D via resistor R10. The U2D circuit is an inverter circuit which outputs its signal 180° out of phase from the signal applied to pin P2, and applies the inverted signal to pin P3 of the XLR connector via capacitor C8 and resistor R13. The signals applied to pins P2 and P3 are then outputed by the connector XLR in known manner to a microphone input on a mixing board of a PA system or the like.

The XLR connector also has a pin P1, which is connected either directly to ground through the switch S3, when the latter is closed, or which is connected to ground through the parallel connected capacitor C12 and resistor R20, when the switch S3 is in its open position, as shown in FIG. 2. This is used to isolate ground of the device from other grounds.

Listed hereinafter are exemplar values of the various resistors and capacitors employed in the above-described circuits.

| Part No. | OHMS | Part No. | Mf. |
|---|---|---|---|
| R1,R20 | 1 Meg. | C1,C12 | 0.1 |
| R2 | 1.13 K. | C2,C4,C6 | 0.01 |
| R3 | 68.1 K. | C3,C5 | 0.001 |
| R4,R6 | 12.1 K. | C7,C8 | 0.33 |
| R5,R7.R9 | 10 K. | C13,C14 | 0.22 |
| R8 | 20 K. | C15,C16,C17 | 0.015 |
| R10,R11 | 2 K. | | |
| R12,R13 | 6.81 K. | | |
| R21 | 470 K. | | |
| R22 | 15 K. | | |
| R23 | 3.32 K. | | |
| R24 | 19.6 K. | | |
| R25,R26,R28 | 10 K. | | |

From the foregoing it will be apparent that the present invention provides relatively simple and inexpensive means for emulating the sound produced by a conventional guitar amplifier and associated microphone, but with improved tonality, and without the introduction of any undesirable background sounds which so often are picked up by a conventional microphone. In other words, since the device disclosed herein is not a microphone, background sound cannot enter into the audio path, and the result is a greater isolation of the guitar's audio signal from any undesirable interfering signals. While the primary advantages of such a device is that the tonality of the audio signal produced by the device disclosed herein not only is unique, but cannot be replicated on most conventional audio mixing boards, graphic equalizers or parametric equalizers. Moreover, unlike any other microphone emulators, the device disclosed herein has two frequency peaks, one at 4 KHz, and the other one at either 90 or 120 Hz by virtue of the use of the switch S2, which is switchable to effect a so-called bright or dark mode of operation. Also, as noted above, the device has the advantage that it can function in several different ways—namely, by plugging the guitar output signal directly into the input 16 to be processed by the filter circuit, while at the same time optionally causing the incoming signal to be directly outputted through the parallel connected receptacle 18 so that the incoming signal can also be sent directly to a guitar amplifier, if desired. Alternatively, the input 16 can receive a line level output jack from a guitar amplifier to have the amplifier signal processed by the filter circuits, or the plug (jacK) from an external speaker output can be inserted into the input 16, but in such case switch S1 should be moved to its broken-line position as shown in FIG. 1 so that the incoming signal will be attenuated via the resistors R21 and R22.

While this invention has been illustrated and detail in connection with only certain embodiments thereof, it will be apparent that it is capable of still further modification. For example, while specific capacitor and resistor values, as well as specific frequency centers (KHz) and gains (dBm) have been listed for the above-described circuits, it will be apparent that this application is intended to cover any variations or modifications thereof as may fall within the scope of one skilled in the art, or the appended claims.

I claim:

1. An analog signal device for processing audio signals produced by an electric guitar, comprising a signal output connector, an input buffer circuit, a plurality of AC filter circuits, and an output drive circuit, each of said circuits having an input and an output, means for connecting the input of said buffer circuit to a supply of AC audio signals produced by an electric guitar, means connecting said AC filter circuits in series with each other, means connecting the output of said buffer circuit to the input of the first of said AC filter circuits that are connected in series with each other, thereby successively to process through the series connected circuits the audio signals received from said supply via said one circuit, means connecting the output of the last of said series connected filter circuits to the input of said output drive circuit, said output drive circuit having the output thereof connected to said output connector to supply thereto the signals processed by said series connected circuits, and a high frequency adder circuit connected in parallel with said series connected circuits between the output of said buffer circuit and the input of said output drive circuit.

2. An analog signal device as defined in claim 1, wherein said adder circuit comprises a capacitor and resistor connected in series between the output of said buffer circuit and the input of said output drive filter circuit.

3. An analog signal device as defined in claim 1, wherein said means for connecting the input of said buffer circuit to said supply of AC audio signals comprises, a first receptacle for receiving the output jack of, selectively, an electric guitar, an electric guitar amplifier, or a speaker, to receive audio signals therefrom, and a manually operable switch movable selectively to provide attenuating impedance when said output jack positioned in said first receptacle is that of a speaker.

4. An analog signal device as defined in claim 3, wherein said means for connecting the input of said buffer circuit to said supply of an audio signal further comprises a second receptacle mounted adjacent to and electrically connected in parallel with said first receptacle, thereby simultaneously to receive any AC signals input to said first receptacle.

5. An analog signal device as defined in claim 1, wherein said first filter circuit in said series thereof functions as a bass boost circuit for the audio signal applied to the input thereof, and said means connecting the output of said buffer circuit to the input of said first filter circuit includes switch means manually operable selectively to change the resistance of said first filter circuit.

6. An analog signal device as defined in claim 5, wherein said switch means is movable between a first position in which the bass boost frequency center and the gain of the audio signal processed thereby are approximately 195 (KHz) and 5.5 dBm, respectively, and a second position in which the bass boost frequency center and the gain are approximately 95 (KHz) and 12.7 dBm, respectively.

7. An analog signal device as defined in claim 1, wherein the output of said first filter circuit in said series thereof is connected to the input of the second filter circuit in said series, and said second circuit in said series thereof functions as an audio signal treble boost circuit in which the trebel boost frequency center and the gain of the signal processed thereby are approximately 4.0 KHz and 8.7 dBm, respectively.

8. An analog signal device as defined in claim 1, wherein there are at least three filter circuits in said series thereof, and the output of said second filter circuit in said series thereof is connected to the input of the third filter circuit in said series, and said third circuit in said series thereof functions as a tuned notch filter to reduce the level in between the bass and treble peaks of the audio signal, and the frequency center and the reduction of the audio signal processed thereby are 1 KHz and −9.3 dBm, respectively.

9. An analog signal device as defined in claim 1, wherein said output connector comprises three signal output pins, and said output drive circuit comprises means for producing at its output two signals, one of which signals is applied to a first one of the signal output pins of said connector, and the other of which is 180° out of phase with said one signal, and is applied to a second one of said signal output pins.

10. An analog signal device as defined in claim 9, including switch means manually operable between a first position in which it connects the third pin of said connector directly to ground, and a second position in which said third pin is connected to ground through a resistor and capacitor connected in parallel with each other.

* * * * *